United States Patent [19]
Cheng

[11] Patent Number: 5,986,905
[45] Date of Patent: Nov. 16, 1999

[54] VOLTAGE CLAMP

[75] Inventor: Kim Tung Cheng, Kwai Chung, The Hong Kong Special Administrative Region of the People's Republic of China

[73] Assignee: PI Electronics (H.K.) Limited, Kowloon, The Hong Kong Special Administrative Region of the People's Republic of China

[21] Appl. No.: 08/960,359

[22] Filed: Oct. 29, 1997

[30] Foreign Application Priority Data

Oct. 30, 1996 [GB] United Kingdom .................. 9622618

[51] Int. Cl.⁶ .......................... H02H 7/122; H02M 3/335
[52] U.S. Cl. .................................. 363/56; 363/20; 363/16
[58] Field of Search ................................. 363/15, 16, 20, 363/21, 18, 19, 50, 55, 56, 97, 131

[56] References Cited

U.S. PATENT DOCUMENTS

| | | | |
|---|---|---|---|
| 4,016,482 | 4/1977 | Cielo et al. ................................. | 323/17 |
| 4,389,702 | 6/1983 | Clemente et al. .......................... | 363/21 |
| 4,688,157 | 8/1987 | Rischmueller ............................. | 363/20 |
| 4,754,385 | 6/1988 | McDade et al. ............................ | 363/16 |
| 5,621,623 | 4/1997 | Kuriyama et al. ......................... | 363/20 |

OTHER PUBLICATIONS

Huber et al., "Optimizing Flyback Topologies for Portable AC/DC Adapter/Charger Applications—Part I: Adapter/Charger Requirements", Power, Aug. 1996, pp. 68–75.

Tong et al., "External–Sync Power Supply with Universal Input Voltage Range for Monitors",Motorola Semiconductor Application Note, 1990, pp. 1–20.

Huber et al., "Optimizing Flyback Topologies for Portable AC/DC Adapter/Charger Applications—Part II: DC/DC Converter Design", Power, Sep. 1996, pp. 34–44.

*Primary Examiner*—Peter S. Wong
*Assistant Examiner*—Y. J. Han
*Attorney, Agent, or Firm*—Leydig, Voit & Mayer, Ltd.

[57] ABSTRACT

A voltage clamp for a single-ended flyback converter provides partial leakage energy recovery and noise suppression. The voltage clamp is an improved version of a conventional RCD clamp. The voltage clamp includes two switches with different turn-off speeds. The voltage clamp includes a capacitor and two resistors. One resistor is connected in parallel with a capacitor and the other resistor is connected in parallel with the faster switch. The faster switch enables at least partial recovery of energy dissipated in a clamp resistor immediately after turn OFF of the slower switch. When the main switch opens after the faster switch closes, noise in the circuit is suppressed by a damping resistor which thereby remains effectively in a current path after the faster switch has re-opened.

4 Claims, 2 Drawing Sheets

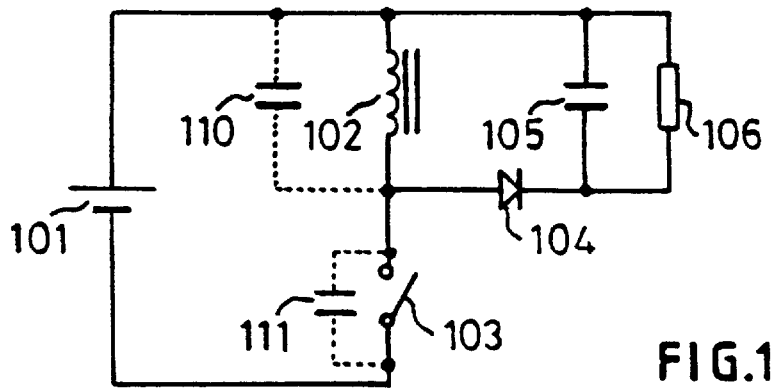
FIG.1 (Prior art)
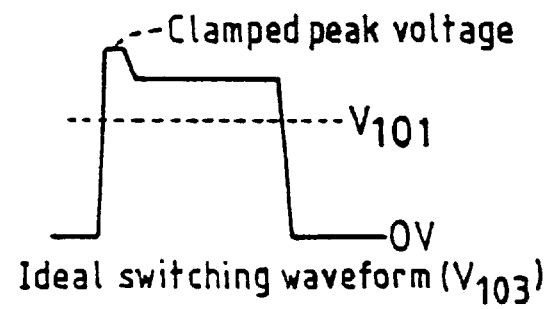
Ideal switching waveform ($V_{103}$)
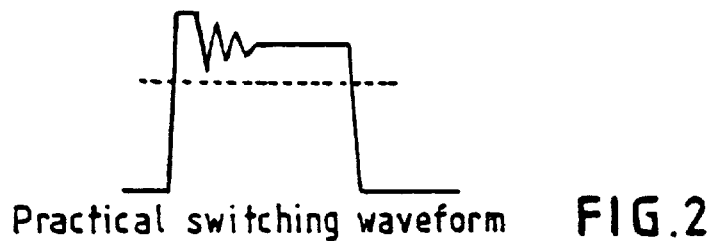
Practical switching waveform FIG.2
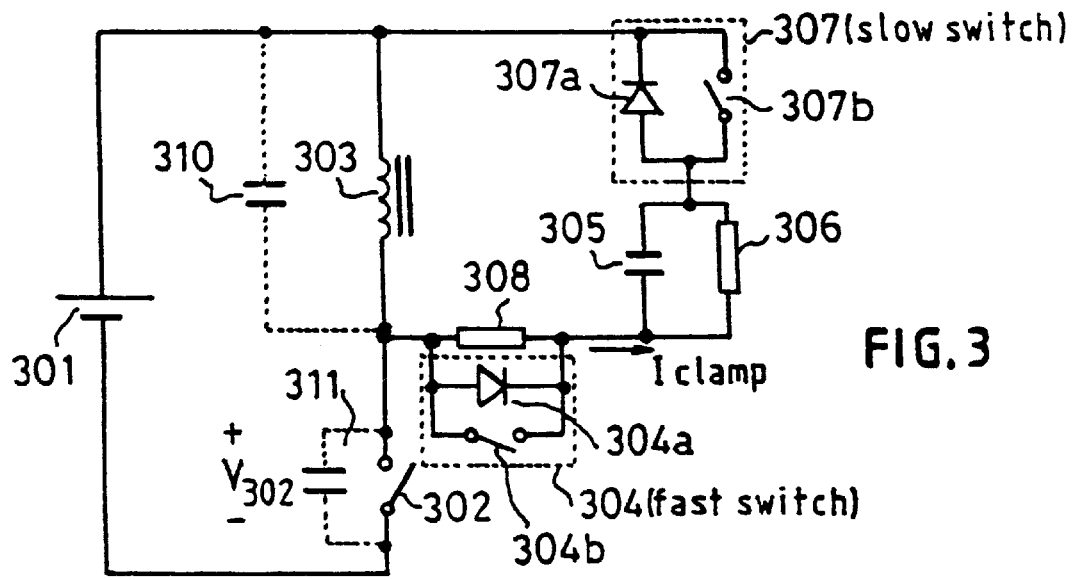
FIG.3

VOLTAGE CLAMP

BACKGROUND OF THE INVENTION

1. Field of the Invention

The invention relates to voltage clamps.

2. Description of Prior Art

The invention relates in particular to voltage clamps for single-ended flyback convertors that limit the peak of switching voltages generated at turn-off of a switch connected to a normal primary winding of a flyback transformer. Conventionally a so-called "RCD clamp" is used. The RCD clamp includes a resistor, a capacitor and a diode where the automatic forward conduction of the diode, at a predetermined voltage differential, limits the voltage developed immediately after the switch (comprising a MOSFET or bipolar transistor, for example) is turned OFF. Significant power losses can occur, especially at more desirable and lower clamp voltages, when an RCD clamp is used.

So-called "active voltage clamps" are known and include a bidirectional switch and a relatively large capacitor which are arranged so as to allow energy stored in leakage inductance to be recycled. This reduces the power loss in the voltage clamp but the circuit complexity and cost make the active clamp unsuitable for low-cost power supplies.

SUMMARY OF THE INVENTION

It is an object of the invention to overcome or at least reduce these problems.

According to the invention there is provided a voltage clamp for a single-ended flyback convertor comprising two switches with different turn-off speeds, the clamp having one resistor in parallel with the faster switch, and a resistor/capacitor parallel circuit in series with the resistor/faster switch parallel circuit and with the slower switch.

Preferably, each of the switches comprises a diode, the diodes having respective different reverse recovery speeds.

BRIEF DESCRIPTION OF THE DRAWINGS

A voltage clamp according to the invention will now be described by way of example with reference to the accompanying drawings in which:

FIG. 1 is a circuit diagram of a conventional RCD clamp;

FIG. 2 shows waveforms of an ideal clamped voltage and a practical clamped voltage;

FIG. 3 shows a circuit diagram of a clamp according to the invention;

DESCRIPTION OF THE PREFERRED EMBODIMENT

Figure 4:
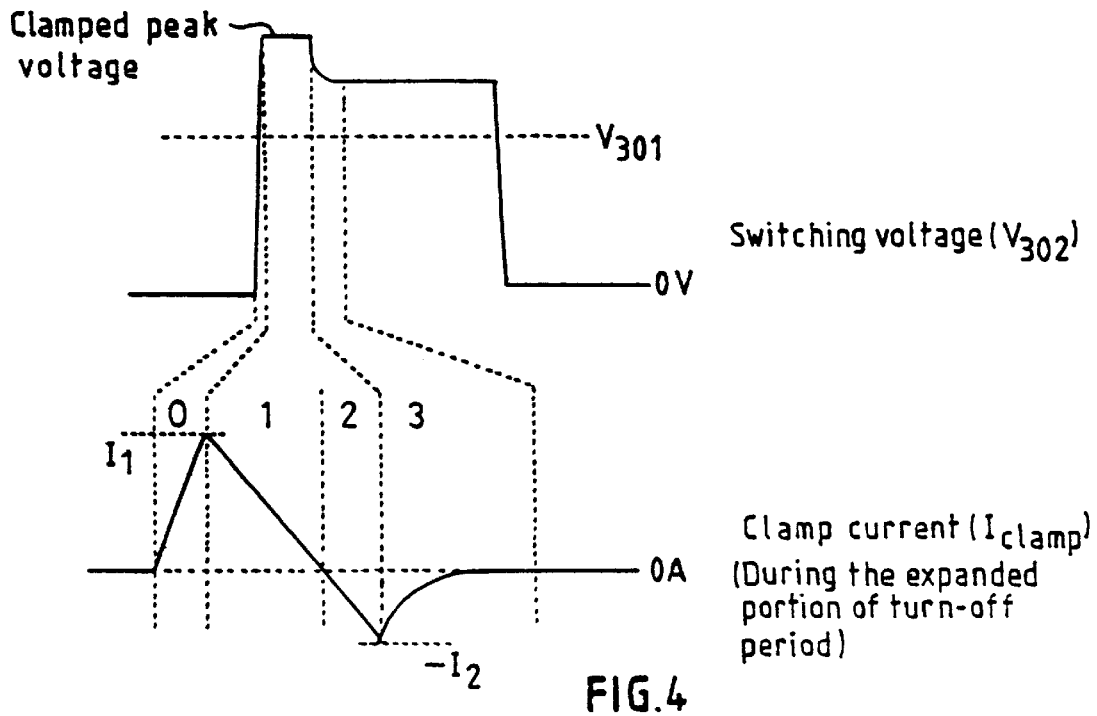
FIG. 4 shows waveforms of the clamp of FIG. 3.

Referring to the drawings, in FIG. 1 a conventional RCD clamp is shown. The circuit comprises a battery 101 which is connected to supply a primary winding 102 of a flyback transformer via a switch 103 (the secondary winding and components are not shown as they are well understood in the art of flyback convertors). The RCD clamp comprises a diode 104, a capacitor 105 and a resistor 106. Inherent parasitic capacitors 110 and 111 are shown with dotted connections. The RCD clamp is required to limit the peak of the switching voltage, which occurs when the switch 103 is opened, due to the existence of leakage inductance in the flyback transformer.

When the switch 103 is opened, magnetic energy stored in the leakage inductance cannot release to the secondary side of the flyback transformer and causes resonant oscillation with the parasitic capacitances 110 and 111. Under normal circumstances, the parasitic capacitances are kept minimum to avoid excessive $CV^2$ energy loss at turn-on and hence they are usually small (in the range of several hundred pF). As the characteristic impedance of the resonant tank and hence the oscillation amplitude of the LC circuit are large, the peak switch voltage is very high. This for example would be more than twice of input voltage without a voltage clamp across the primary winding of the flyback transformer or the main switch. Thus, an RCD clamp (106, 105, 104) is used in common practice to clip the large-amplitude parasitic oscillation so that a lower voltage rating device can be used as the switch 103.

The ideal switch voltage waveform is shown in the upper part of FIG. 2. Immediately after turn-off, the switch voltage rises rapidly. When the voltage reaches the voltage of the capacitor 105 plus the input voltage, the diode 104 conducts and the switch voltage is clamped at that level until all energy stored in the leakage inductance vanishes. The clamped peak voltage is controlled by the resistance of a resistor 106. The switch voltage then stays at the level of the reflected secondary voltage plus the input voltage until the end of the off period. Here, continuous conduction mode is assumed and it can be shown that the power loss of an ideal RCD clamp is $$P_{clamp} = \frac{1}{2} L_1 I_{pk}^2 f_2 \left(1 + \frac{nV_o}{V_{pk} - V_{cc} - nV_o}\right) = \frac{(V_{pk} - V_{cc})^2}{R_{clamp}}$$

where $L_1$=leakage inductance reflected to the primary side
$I_{pk}$=primary peak current
$f_s$=switching frequency
n=turn ratio between primary and secondary windings
$V_o$=output voltage
$V_{pk}$=peak main switch voltage
$V_{cc}$=DC input voltage
$R_{clamp}$=resistance of the clamp resistor.

From the above formula, the minimum power loss in the RCD clamp is the power stored in the leakage inductance. But this occurs when the clamp voltage is infinite. In general, a lower clamp voltage (and hence a lower peak main switch voltage) leads to a higher power loss in the RCD clamp. In actual cases, some troublesome high-frequency parasitic oscillations (as shown in the lower part of FIG. 2) usually occurs after the diode 104 is turned off. Again, this is due to the resonant oscillation of the leakage inductance and the parasitic capacitances. In such a case, an RC snubber may be added across the switch 103, or the primary winding 102 of the flyback transformer, to suppress this stray oscillation which may be harmful to electromagnetic compatibility. However, the RC snubber causes additional power loss. Also, it will be noted that the amplitude of the stray oscillation directly relates to the reverse recovery time of the diode 104. In order to minimize the stray oscillation amplitude, an ultra-fast diode (e.g. BYV26C from Philips) may be used in the place of 104.

However, in preference embodiments of the present invention provide an improved RCD clamp comprising two switches which have different turn-off speeds. They are essentially connected in series. The faster switch is responsible to recycle part of the leakage energy to the output circuit while the slower switch, together with a damping resistor in parallel with the faster switch, provide noise suppression after the faster switch is turned off, as described with reference to FIG. 3.

In this improved RCD clamp, part of the leakage energy is recycled without any additional noise generation. The switching voltage waveform (see FIG. 4) resembles the ideal one and the switches in the clamp only need to handle peak currents over a relatively short duration after each turn-off. Moreover, the switches in the improved clamp do not require accurate control timings for their operation; this reduces the circuit complexity and hence the cost.

In FIG. 3, the numbers correspond to respective components in FIG. 1 and it will be seen that the diode 104 has been replaced by a fast switch 304 comprising a diode 304a and a switch 304b connected in parallel. The fast switch 304 is in turn connected in parallel with a damping resistor 308. The circuit also includes a (relatively) slow switch 307 comprising a diode 307a and a switch 307b. The slow switch is connected in series with a parallel connection of a capacitor 305 and a resistor 306 (equivalent to capacitor 105 and resistor 106 of FIG. 1).

The main idea of embodiments of the present invention is to improve the conventional RCD clamp in two aspects—to recover part of the power loss in the clamp and to minimize the stray oscillation after the clamp diode is turned off. The manifestation of the improvement takes place in effect in two phases.

In order to recover part of the energy dissipated in the clamp resistor, reverse current conduction is necessary in the clamp diode. Hence a bidirectional switch 304 replaces the clamp diode 104 in FIG. 1. It is assumed that in the first phase the other bidirectional switch 307 is shorted for this discussion. The corresponding clamp current during the forward and reverse conduction periods of the bidirectional switch is shown in period 2 and 3 of FIG. 4. Theoretically, if the reverse conduction time is as long as the forward conduction time and the clamp voltage remains constant during these two conduction periods, then all energy losses stated by the formula of the conventional RCD clamp can be completely recovered. This is similar to an active clamp, but the whole clamp action is completed over a much shorter period rather than over the whole turn-off period as in the case of an active clamp. As a result, the peak clamp voltage of the improved RCD clamp is higher than of an active clamp. This should not be viewed as a shortcoming because as far as the improved RCD clamp circuit is concerned using a "self-controlled" bidirectional switch is much simpler than using an active clamp. In general or in practice, the reverse conduction time is less than the forward conduction time and the energy losses in the clamp resistor can only be partially recovered. The reverse conduction time can be freely controlled by the switch 304b.

Most of the fast-recovery and ultra fast-recovery diodes available are snap recovery. Therefore, when the clamp diode (104 in FIG. 1) of the conventional RCD clamp turns off, the leakage inductance of the flyback transformer and the parasitic capacitances across the primary winding (110 and 111 in FIG. 1) will cause stray oscillation. The oscillation amplitude increases with the magnitude of the reverse current when the clamp diode turns off. Thus, although longer reverse conduction time saves more energy dissipated in the clamp resistor, this is penalized by more severe parasitic oscillation after the turn-off of the bidirectional switch 304.

The damping circuit formed by the bidirectional switch 307 and the resistor 308 is introduced as the second phase. The damping action occurs in the period 3 of the switching waveform shown in FIG. 4. At the end of period 2, the switch 304b is turned off and the reverse current is forced to flow through the resistor 308. The bidirectional switch 307 remains on at least from period 0 to period 3; it is a slower switch than the faster switch 304. As the switch 304 is substituted by the damping resistor 308 in period 3, the parallel resonant circuit formed by the leakage inductance of the flyback transformer, the primary parasitic capacitance and the damping resistor is damped, and the stray oscillation is thus suppressed. For proper circuit operation, the capacitance of 305 should be much larger than the primary parasitic capacitance. The slower switch may be turned off any time after the reverse current decreases close to zero, but before the switch 302 is switched on again.

The following summaries the circuit operation of all characteristic periods shown in FIG. 4:

Period 0—The main switch 302 is turned off. The switch voltage rises to the clamped peak voltage and the clamp current ($I_{clamp}$) rises from 0 to $I_1$ (the primary peak current). Then the diode 304a of the bidirectional switch 304 and the diode 307a of the bidirectional switch 307 conduct.

Period 1—The clamp current (also the primary current) decreases from the positive peak current $I_1$ to zero with a discharging slope of (Clamped peak voltage—input voltage—reflected secondary output voltage)/Leakage inductance. The resonant frequency of the leakage inductance and the primary parasitic capacitance is assumed to be much smaller than the total time duration of period 0, 1, 2 and 3.

Period 2—Before the clamp current crosses zero, the switch 304b of the bidirectional switch 304 and the switch 307b of the bidirectional switch 307 are turned on. The clamp current reverses its direction and becomes negative. But the dI/dt slope is same as in period 1. This period ends when the switch 302b of the fast switch 304 is turned off at the clamp current $-I_2$.

Period 3—The slow switch 305 remains on. The clamp current is damped from $-I_2$ to zero by the damping resistor 308.

Figure 5:
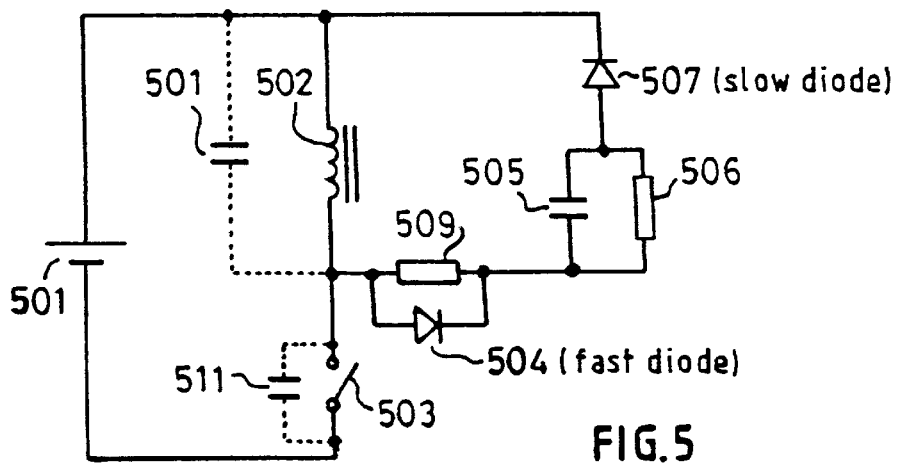
FIG. 5 shows a circuit diagram of another clamp according to the invention.

The simplest practical implementation of the improved RCD clamp is shown in FIG. 5. Each bidirectional switch (304 and 307 in FIG. 3) is implemented by a rectifier with finite reverse recovery time. Hence, the two bidirectional switches 504 and 507 are single rectifiers without any external control circuit. Two example rectifier pairs are:

| Fast SW | Slow SW | Switching frequency range |
| --- | --- | --- |
| MUR140 Motorola ($t_{rr}$ = 75 ns) | ERB43-08 Fuji ($t_{rr}$ = 0.4 µs) | 100K–1 MHz |
| 1N4935 GI ($t_{rr}$ = 200 ns) | GP08J GI ($t_{rr}$ = 2 µs) | 20–250 KHz |

Alternatively, in order to implement the improved RCD clamp, the clamping resistor 308 and fast switch 304 in FIG. 3 may be replaced by a single rectifier with reverse leakage characteristics. In such circumstances, the function of the clamping resistor 308 during the period when the fast switch 304 is turned off is carried out by the single rectifier by means of its reverse leakage characteristics.

Note that the reverse recovery time $t_{rr}$ is different from the time duration of period 2 in FIG. 4. In general, the actual reverse recovery time depends on the circuit parameters, the reverse recovery time of the slower rectifier is approximately five to ten times longer than the faster rectifier in each pair.

Figure 6:
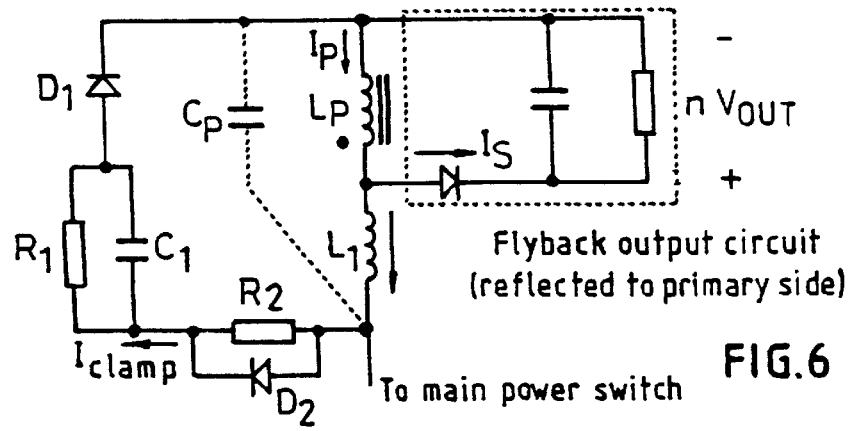
FIG. 6 is an equivalent circuit of part of the circuit of FIG. 5.

The improved RCD clamp is theoretically analyzed with reference to FIG. 6 and the power saving of the improved clamp circuit over the conventional RCD clamp will become apparent. FIG. 6 shows the equivalent circuit of a single-ended flyback convertor operating with the improved RCD clamp during the turn-off period of the main switch. The output circuit is reflected to the primary side (encircled by dotted rectangle). The leakage inductance of the flyback transformer is modelled as a lumped inductance $L_1$ in series with the magnetizing inductance $L_P$. For simplicity, the two bidirectional switches are represented by two rectifiers with finite reverse recovery time (as in FIG. 5). $D_1$ is the slower diode and $D_2$ is the faster diode. The capacitance $C_P$ is the lumped parasitic capacitance seen by the primary winding. Other components ($R_1$, $R_2$, and $C_1$) in the clamp have one-to-one correspondence with FIG. 5.

Two more assumptions are made. Firstly, the damping resistor $R_2$ is adjusted so that the parallel resonant circuit formed by $L_1$ and $C_P$ is critically damped. The corresponding condition is, $$\xi = \frac{1}{2R_2}\sqrt{\frac{L_1}{C_P}} = 1 \quad \text{(damping ratio)}$$

and both the clamp current and the primary voltage are exponential with a decay time constant of the recipical of the angular resonant frequency $\omega_n$.

The second assumption is that the capacitance $C_1$ is large enough to hold the capacitor voltage of $C_1$ ($V_C$) fairly constant over switching cycles.

The power loss in the clamp can then be calculated as follows:

$$P_C = \left[ V_C \int^{t_{off}} I_{clamp} dt + \int^{t_3} I^2_{clamp} R_2 dt \right] f_s$$

The time duration shown on the top of the integral sign means that the integration is carried out over the time period. The total turn-off time of the main switch is denoted as $t_{off}$ and the time duration of period 3 is $t_3$. The first part of the power loss is dissipated in the clamp resistor $R_1$ and the second part is dissipated in the damping resistor $R_2$. Both are greater or equal to zero.

The effect of the time duration ($t_2$) of period 2 is discussed as follows. The negative peak current $I_2$ is linearly dependent on the time duration $t_2$ because the clamped peak voltage is essentially constant and hence the dI/dt slope of the clamp current is also constant. The slope can be shown to be ($V_C$-$nV_o$)/$L_1$. As the time interval $t_2$ increases, the average clamp current (the first integral) decreases because the negative part of the clamp current offsets the positive part more. This results in less power dissipation in the clamp resistor $R_1$. However, as the negative peak current $I_2$ increases, the power dissipation in the damping resistor $R_2$ also increases. Therefore, the dependence of the two integrals on the time interval $t_2$ have opposite effects on the total power dissipation of the clamp.

The total power loss $P_C$ of the high-efficiency RCD clamp can be shown to be, $$P_C = \frac{1}{2}\frac{V_C}{V_C - nV_O} L_1 I_1^2 f_s - \left( \frac{V_C^2 - (nV_O)^2}{4L_1} t_2^2 + \frac{V_C(V_C - nV_O)}{\omega_n L_1} t_2 \right) f_s$$

where $$\omega_n = \frac{1}{\sqrt{L_1 C_P}}$$

(resonant frequency). The first term is equal to the power loss of the conventional RCD clamp. The power saving of the high-efficiency RCD clamp relative to the conventional RCD clamp is the whole second term which is a function of the time interval $t_2$. From this equation, the power loss may be reduced to zero by increasing the time interval $t_2$ to a certain value. But as stated before, the minimum power loss in the high-efficiency RCD clamp is the power loss in the damping resistor which is in practice is not totally recovered.

We claim:

1. A voltage clamp for a single-ended flyback converter comprising:

first and second switches having respective first and second turn-off speeds, the first turn-off speed being faster that the second turn-off speed, a first resistor connected in parallel with the first switch, forming a first parallel circuit, and a second resistor and a capacitor forming a second parallel circuit connected in series with and between the first parallel circuit and the second switch.

2. The voltage clamp according to claim 1, wherein the first and second switches comprise first and second diodes, the first and second diodes having respective different reverse recovery speeds.

3. The voltage clamp according to claim 1, wherein the first parallel circuit comprises a first diode having a first reverse recovery speed and the second switch comprises a second diode having a second reverse recovery speed slower than the first reverse recovery speed.

4. The voltage clamp according to claim 3, wherein the second diode has reverse leakage characteristics.

* * * * *